United States Patent [19]

Yamamoto

[11] 4,398,181

[45] Aug. 9, 1983

[54] KEYBOARD ENTRY SYSTEM

[75] Inventor: Takemi Yamamoto, Nagoya, Japan

[73] Assignee: Brother Kogyo Kabushiki Kaisha, Nagoya, Japan

[21] Appl. No.: 247,010

[22] Filed: Mar. 24, 1981

[30] Foreign Application Priority Data

Apr. 15, 1980 [JP] Japan ................................. 55-50185

[51] Int. Cl.³ ................................................ G06F 3/02
[52] U.S. Cl. .............................. 340/365 S; 340/365 C
[58] Field of Search ............ 340/365 C, 365 E, 365 S, 340/825.79

[56] References Cited

U.S. PATENT DOCUMENTS 3,921,166 11/1975 Volpe .............................. 340/365 C Primary Examiner—James J. Groody
Attorney, Agent, or Firm—Moonray Kojima

[57] ABSTRACT

A key matrix circuit comprises a plurality of column lines and a plurality of row lines, a plurality of capacitance switches which are respectively arranged at different intersections of the column lines and row lines, and a select switch having a condenser, a movable contact connected to a selected one of the column lines and a plurality of change-over fixed contacts, respectively, connected to different row lines other than the row lines to which the selected column line is connected through the capacitance switches. Each of the fixed contacts is selectively connected to the movable contact and the selected column line is connected to one of the different row lines through the condenser which has an equivalent capacitance to the capacitance switches when operated. A decoder and a multiplexer are respectively connected to the row lines and the column lines of the key matrix circuit. A control circuit scans cyclically the respective conditions of the capacitance switches and the select switch through the decoder and multiplexer. As a result, a simpler circuit and method of operation are obtained.

4 Claims, 2 Drawing Figures

KEYBOARD ENTRY SYSTEM

BACKGROUND OF THE INVENTION

1. Field of the Invention

This invention relates to keyboard entry systems, and more particularly, to such keyboard entry systems which are equipped with both contactless capacitance switches and contact switches.

2. Description of the Prior Art

Switches which may be used in keyboard entry systems for the entry of alpha-numeric or other information, include contact type switches and contactless type switches, such as capacitance switches, magneticallly sensitive switches using Hall elements, and the like. It is more desirable to use contactless switches, which excel in durability and reliability, in keyboard entry systems or the like, used, for example, as a terminal device for a computer. In keyboard entry systems having contactless switches, nevertheless, it is necessary, as the case may be, to also provide select switches, such as rotary switches, slide switches, and the like, which are constructed to select one of a plurality of switching contacts. However, since it is difficult to construct such select switches using contactless switches, keyboard entry systems requiring such select switches having contacts. Thus, in such keyboard entry systems, a circuit is required to separately scan the respective operating conditions of the two types of switches. Accordingly, construction and control operation of such systems are complex.

SUMMARY OF THE INVENTION

It is an object of the invention to provide an improved keyboard entry system.

Another object is to provide a keyboard entry system which can scan both the capacitance switches and the contact switches within the same keyboard matrix circuit.

Still another object is to provide a keyboard entry system which can be constructed of simple control circuitry.

A further object is to provide an inexpensive keyboard entry system which is equipped with both contactless capacitance switches and contact switches, and which can be easily fabricated.

The foregoing and other objects of the invention are attained in an inventive keyboard entry system comprising a key matrix circuit having capacitance switches arranged at each intersection of a plurality of column lines and a plurality of row lines, a decoder connected to the row lines, a multiplexer connected to the column lines, and a control circuit for controlling the decoder and the multiplexer and for consecutively scanning the respective capacitance switches in the key matrix circuit. A select switch comprising a condenser, a movable contact and a plurality of change-over fixed contacts, is arranged with the movable contact connected to a selected one of the column lines of the key matrix circuit, and the change over fixed contacts are respectively connected to different row lines in the key matrix circuit other than the row lines to which the selected column line is connected through the capacitance switches. The selected column line is connected to one of the different row lines through the condenser which has an equivalent capacitance to the capacitance switches when operated. The switched conditions of the select switch are selectively scanned by the control circuit, which is made operative to select the respective column lines and row lines of the key matrix circuit, thereby to consecutively selectively scan the respective capacitance switches.

DETAILED DESCRIPTION OF THE PREFERRED EMBODIMENTS

Figure 1:
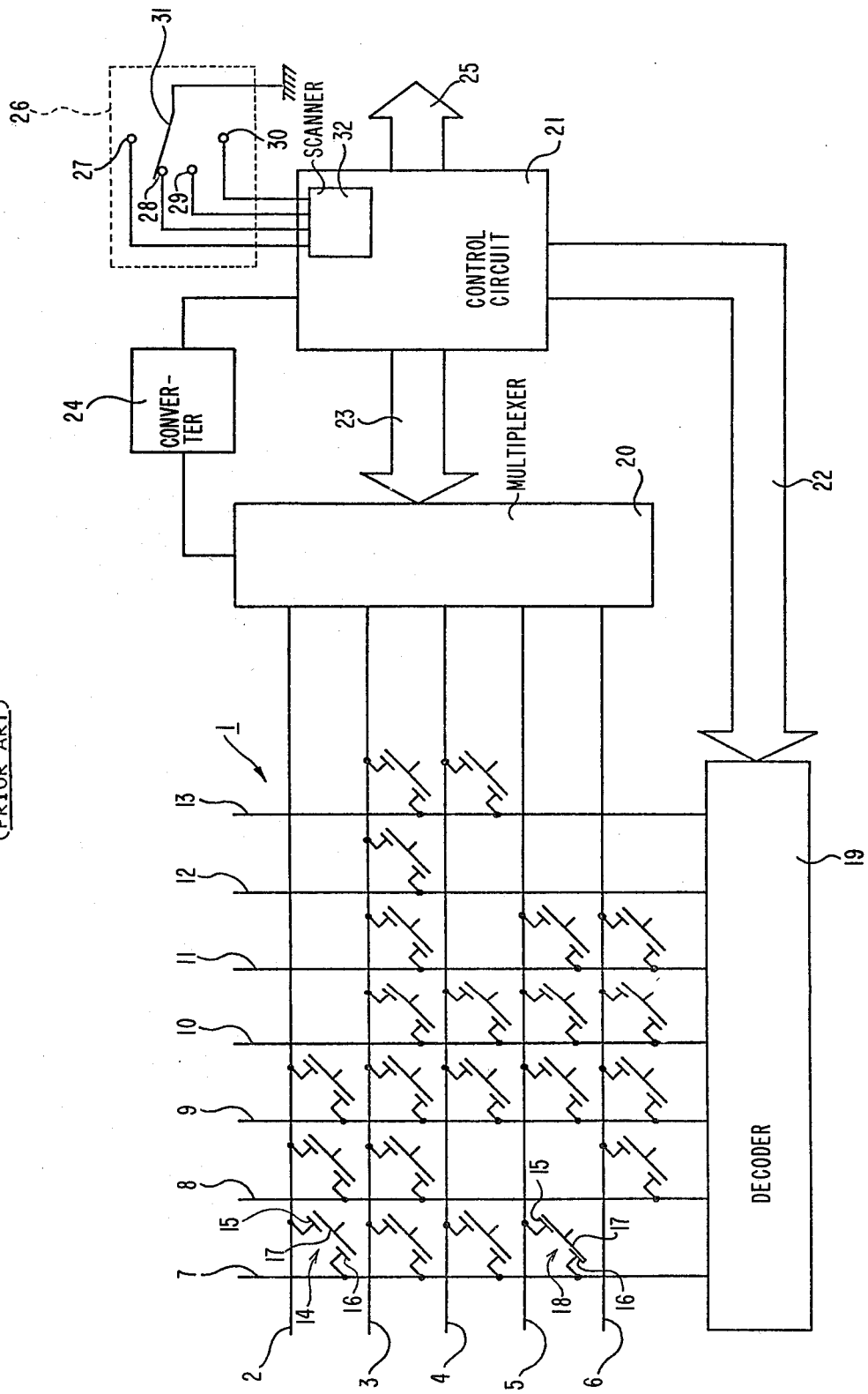
FIG. 1 is a functional flow diagram illustrating the principle of operation of a conventional type keyboard entry system.

To better understand the instant invention, a brief description of a conventional keyboard entry system, such as depicted in FIG. 1, is in order. In FIG. 1, a key matrix circuit 1, is equipped with column lines 2-6 and row lines 7-13 (conversely, the column lines may be designated as the row lines and the row lines as the column lines). A capacitance switch 14 is arranged at each of the intersections of the column lines and row lines. The capacitance switch 14 comprises a first capacitor plate 15 connected to one of the column lines 2-6, a second capacitor plate 16 connected to one of the row lines 7-13, and a movable capacitor plate 17 disposed opposite the first and second plates 15 and 16. The first and second plates 15 and 16 are provided on a keyboard plate and a movable plate 17 is mounted on a lower side of a key top (not shown). As simply indicated at numeral 18, when the key top is depressed so that the movable plate 17 is brought to approach the first and second plates 15 and 16, the capacitance between these two pads 15 and 16 is abruptly increased so that a high frequency signal is transmitted from row line 7 to column line 5. The construction of such key matrix circuit and capacitance switches is similar to that disclosed in U.S. Pat. No. 3,921,166 issued to John W. Volpe on Nov. 18, 1975, and entitled "Capacitance Matrix Keyboard".

The row lines 7-13 are connected to a decoder 19 and the column lines 2-6 are connected to a multiplexer 20. A control circuit 21 is made operative to feed decoder 19 and multiplexer 20, respectively, with a signal 22 for selecting one of the row lines 7-13 and a signal 23 for selecting one of the column lines 2-6 so that the intersections of the row lines 7-13 and the column lines 2-6 may be consecutively and selectively scanned. If a signal having passed through operated switch 14 appears at a certain column line, when selected, it is fed through the multiplexer 20 and a circuit 24 to the control circuit 21. In the multiplexer 20, an OR gate (not shown) controlled by control circuit 21 is connected to all the column lines 2-6 and feeds out the output signal to the circuit 24. The circuit 24 converts the high frequency signal, having passed through an operated capacitance switch 14 and the OR gate, into a pulse signal at a predetermined level and feeds out that pulse signal to control circuit 21. This control circuit 21 generates partly a coded signal corresponding to the operated capacitance switch 14 from the contents of the row selecting signal 22 and the column selecting signal 23, at the instant when the operation of the capacitance switch 14 is detected through the output of the circuit 24, and partly feeds the output of that coded signal to an external device (not shown) through a signal line 25. The operation of the keyboard entry system having the capacitance switches thus far described is similar to that described in the abovementioned U.S. Pat. No. 3,921,166.

A select switch 26, which may be of the rotary type, slide type, or the like, although shown in simplified form, is constructed so that any one of the four fixed contacts 27-30, for example, is grounded to earth through a movable contact 31. The control circuit 21 is equipped with another scanning circuit 32, which has no relationship with the scanning operation of the aforementioned key matrix circuit, and which is connected to the respective fixed contacts 27-30 of the select switch 26. Each time the select switch 26 is selectively operated or each time one of the capacitance switches 14 of the key matrix circuit 1 is operated, the connected condition of the select switch 26 is scanned so that a coded signal having a message content corresponding thereto is fed out of the signal line 25 or so that it is used for the formation of a coded signal corresponding to the capacitance switch 14, which is effected in control circuit 21. The construction of the keyboard entry system thus far described, complicates the construction of the control circuit 21 and requires a series of programmed data processing operations, in which case the control circuit 21 may be a so-called "micro-computer" which may be constructed of a microprocessor, a ROM and a RAM.

Figure 2:
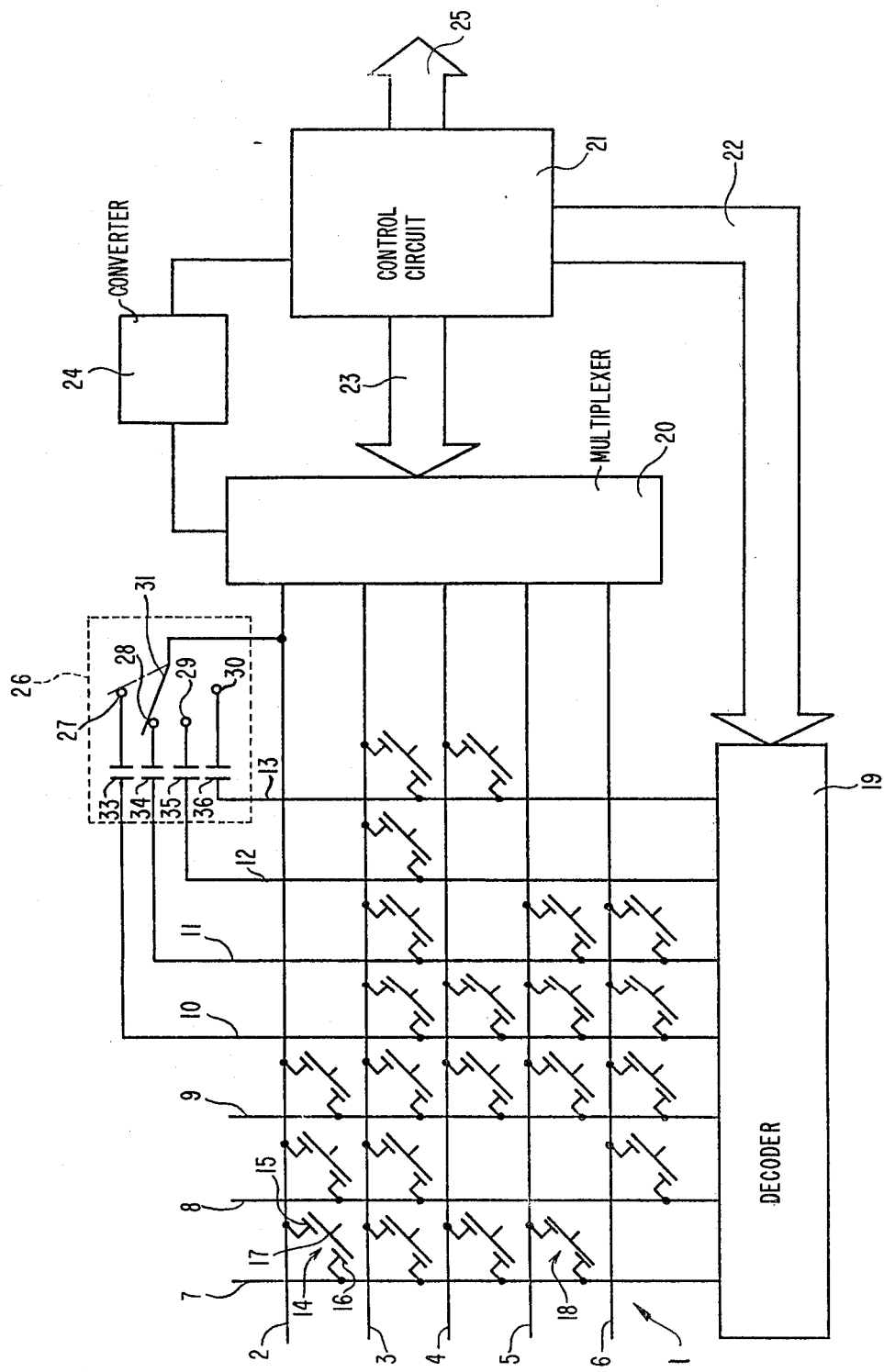
FIG. 2 is a functional flow diagram illustrating the principle of operation of an illustrative embodiment of the invention.

The instant invention overcomes the foregoing and other deficiencies of the prior art. In FIG. 2, which illustrates a preferred embodiment of the invention, there is depicted a keyboard entry system, which is substantially similar to that shown in FIG. 1, but wherein the select switch 26, is connected to the key matrix circuit, rather than to the control circuit. In FIG. 2, the components similar to the components in FIG. 1, bear the same numeral and hence need no further discussion hereat.

The select switch 26, in FIG. 2, has its fixed contacts 27-30 connected to row lines 10-13 of the key matrix circuit 1, respectively, through condensers 33-36, which has the same capacitances as those appearing between plates 15 and 16 of the operated capacitance switch 14, and has its movable contact 31 connected directly to column line 2, as depicted. As a result, when control circuit 21 scans key matrix circuit 1 through decoder 19 and multiplexer 20, a signal is transmitted from row line 11 through column line 2 when row line 11 and column line 2, are selected, if movable contact 31 is connected to the fixed contact 28, as depicted, so that circuit 24 generates a pulse signal similar to the case wherein the capacitance switch 14 is operated, and feeds the same to control circuit 21. This control circuit 21 can detect that fixed terminal 28 of select switch 26 is selected through column line 2 and row line 11 of matrix circuit 1, which are selected at that instant similarly to the case of capacitance switch 14.

As hereinbefore discussed, control circuit 21 can partly scan the connected condition of select switch 26 during the process wherein the contactless capacitance switches 14 and the select switch 26 are consecutively selected, without requiring any changes in the construction of the decoder 19, multiplexer 20, and circuit 24, all of which are used to scan the capacitance switches 14. Furthermore, control circuit 21 can partly prepare for the scanning operation of the subsequent capacitance switch 14 either by directly feeding out the scanned results to an external device through signal line 25 or by storing the results in an internal register (not shown). As a result, even if control circuit 21 is constructed of a micro-computer, it is possible to detect the conditions of capacitance switches 14 and select switch 26 by a remarkably simple control operation. Moreover, it is not necessary to add any special circuits or any special wirings to the microcomputer for scanning the conditions of the select switch, thus resulting in substantial savings in cost, and in substantial simplification of construction. The row lines 10-13 and column line 2 which are connected to the fixed terminals 27-30 and movable contact 31, of the select switch 26 should be constructed so as to not interfere with the scanning of the capacitance switches 14.

It is further understood by those skilled in the art that the foregoing description is a preferred embodiment of the invention, and that various changes and modifications may be made without departing from the spirit and scope of the invention.

What is claimed is:

1. A keyboard entry system having a key matrix circuit, comprising
    a plurality of column lines and a plurality of row lines;
    a plurality of capacitance switches respectively arranged at different intersections of said column lines and row lines, each of said capacitance switches including a first capacitor plate connected to one of said column lines, a second capacitor plate connected to one of said row lines, and an actuating member for abruptly changing the value of capacitance between said first and second plates when operated; and
    a select switch having a condenser, a movable contact connected to a selected one of said column lines and a plurality of fixed contacts, respectively, being connected to different row lines other than the row lines to which said selected column line is connected through said capacitance switches,
    each of said fixed contacts being selectively connected to said movable contact, whereby said selected column line is connected to one of said different row lines through said condenser which has an equivalent capacitance to that appearing between said first and second capacitor plates of said capacitance switches when operated, whereby the selected condition of said select switch and the operated condition of said capacitance switches are selectively scanned with the concurrent sequential selection of one of said column lines and one of said row lines.

2. The system of claim 1, comprising control means for cyclically selecting one of said row lines and one of said column lines in said key matrix circuit at the same time in a predetermined sequence, whereby said capacitance switches and said select switch are selectively scanned according to the selecting conditions of said column line and said row lines.

3. The system of claim 2, wherein said control means comprises a row select circuit connected to all of said row lines, a column select circuit connected to all of said column lines, a control circuit connected to said row select circuit and said column select circuit for cyclically selecting one of said row lines and one of said column lines in a predetermined sequence through said select circuits in order to scan each of said capacitance switches and select switch connected to said selected row line and column line.

4. A keyboard entry system comprising a key matrix circuit including a plurality of column lines and a plurality of row lines, a plurality of capacitance switches respectively arranged at different intersections of said column lines and row lines, each of said capacitance switches having a first capacitor plate connected to one of said column lines, a second capacitor plate connected to one of said row lines and an actuating member for abruptly changing the value of the capacitance between said first and second plates when operated, and a select switch having a condenser, a movable contact connected to selected one of said column lines and a plurality of fixed contacts respectively connected to different row lines other than the row lines to which said selected column line is connected through said capacitance switches, each of said fixed contacts being selectively connected to said movable contact, whereby said selected column lines is connected to one of said different row lines through said condenser which has an equivalent capacitance to that appearing between said first and second plates of said capacitance switches when operated; and control means having a circuit means connected to all of said row lines and to all of said column lines, for feeding out a signal transmitted between one of said row lines and one of said column lines, both being connected to said operated capacitance switches or said condenser, a converting circuit connected to said circuit means for converting said signal into another pulse signal at a predetermined level, a control circuit connected to said circuit means and to said converting circuit, for selecting one of said row lines and one of said column lines in a predetermined sequence through said circuit means in order to detect the condition of each of said capacitance switches and said select switch according to selecting conditions of said column lines and of said row lines at the time when said pulse signal is fed from said converting circuit to said control circuit.

* * * * *